(12) United States Patent
Love et al.

(10) Patent No.: US 6,363,315 B1
(45) Date of Patent: Mar. 26, 2002

(54) APPARATUS AND METHOD FOR PROTECTING ENGINE ELECTRONIC CIRCUITRY FROM THERMAL DAMAGE

(75) Inventors: William J. Love, Dunlap; Brian G. McGee, Chillicothe, both of IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 09/616,091

(22) Filed: Jul. 13, 2000

(51) Int. Cl.⁷ .......................... F02D 41/04; H01L 23/34; H05K 7/20
(52) U.S. Cl. .................. 701/104; 123/478; 257/467; 257/713; 361/688; 361/717
(58) Field of Search .................. 701/101, 102, 701/103, 104, 105; 123/41.31, 647, 478, 480, 486; 257/467, 713; 361/688, 704, 717, 718, 719, 722

(56) References Cited

U.S. PATENT DOCUMENTS

| | | | |
|---|---|---|---|
| 4,571,683 A | | 2/1986 | Kobayashi et al. |
| 4,576,135 A | | 3/1986 | Johnson |
| 4,621,599 A | | 11/1986 | Igashira et al. |
| 4,704,999 A | | 11/1987 | Hashikawa et al. |
| 4,729,056 A | | 3/1988 | Edwards et al. |
| 4,836,161 A | | 6/1989 | Abthoff et al. |
| 4,922,878 A | | 5/1990 | Shinogle et al. |
| 4,990,987 A | * | 2/1991 | Boucher et al. ............ 257/467 |
| 5,020,979 A | | 6/1991 | Askew |
| 5,070,836 A | | 12/1991 | Wahl et al. |
| 5,113,833 A | | 5/1992 | Nagano et al. |
| 5,245,972 A | | 9/1993 | Denz et al. |
| 5,267,545 A | | 12/1993 | Kitson |
| 5,268,842 A | | 12/1993 | Martson et al. |
| 5,277,164 A | | 1/1994 | Takahashi et al. |
| 5,320,079 A | | 6/1994 | Kuwabara |

(List continued on next page.)

FOREIGN PATENT DOCUMENTS

| | | | | |
|---|---|---|---|---|
| DE | 19860762 | * | 12/1998 | |
| EP | 0 221 832 A2 | | 5/1987 | |
| GB | 2 182 460 | * | 5/1987 | |
| GB | 2 323 684 | * | 9/1998 | |
| GB | 2 357 593 | * | 6/2001 | |
| JP | 5-243432 A | * | 9/1993 | ................. 257/713 |
| JP | 8121227 | * | 5/1996 | |
| JP | 9126044 | * | 5/1997 | |

OTHER PUBLICATIONS

SAE Feb. 24–27, 1997 A New Concept for Low Emission Diesel Combusion – Printed from Diesel Engine Combustion Processes and Emission Control Technologies (SP-1246).

*Primary Examiner*—Willis R. Wolfe

(57) ABSTRACT

A control system and method for protecting engine electronic circuitry from thermal damage including an electronic controller coupled to the engine, and one or more sensors coupled to the controller for inputting at least one signal indicative of a condition which can be correlated to the temperature of the electronic circuitry. The controller is operable to establish the temperature of the electronic circuitry based upon the at least one sensor input and to output a signal to effectively lower the temperature of the electronic circuitry when the temperature of such circuitry exceeds a predetermined threshold temperature. The sensor inputs to determine or establish a correlation between the input signal and the temperature of the electronic circuitry may include sensing engine speed, sensing the voltage level of the power source providing electrical power to the circuitry, or sensing the temperature of the circuitry directly. The signal outputted by the controller to effectively lower the temperature of the circuitry may include a signal to control the number of fuel shots delivered to the engine during a particular fuel injection event, and/or the firing frequency of the fuel injectors, and/or a signal to restrict engine performance for at least a specified period of time.

37 Claims, 1 Drawing Sheet

U.S. PATENT DOCUMENTS

| | | | |
|---|---|---|---|
| 5,379,733 A | 1/1995 | Haddick et al. | |
| 5,427,072 A | 6/1995 | Udo | |
| 5,427,083 A | 6/1995 | Ahern | |
| 5,450,829 A | 9/1995 | Beck | |
| 5,460,128 A | 10/1995 | Kruse | |
| 5,492,098 A | 2/1996 | Hafner et al. | |
| 5,499,608 A | 3/1996 | Meister et al. | |
| 5,507,260 A | 4/1996 | Hintzen | |
| 5,540,205 A | 7/1996 | Davis et al. | |
| 5,549,092 A | 8/1996 | Hasegawa et al. | |
| 5,566,650 A | 10/1996 | Kruse | |
| 5,566,660 A | 10/1996 | Camplin et al. | |
| 5,569,950 A | * 10/1996 | Lewis et al. | 257/467 |
| 5,588,415 A | 12/1996 | Ahern | |
| 5,609,131 A | 3/1997 | Gray, Jr. et al. | |
| 5,634,448 A | 6/1997 | Shinogle et al. | |
| 5,647,317 A | 7/1997 | Weisman, II et al. | |
| 5,678,521 A | 10/1997 | Thompson et al. | |
| 5,685,273 A | 11/1997 | Johnson et al. | |
| 5,701,870 A | 12/1997 | Gottshall et al. | |
| 5,704,336 A | 1/1998 | Wrobel | |
| 5,722,373 A | 3/1998 | Paul et al. | |
| 5,732,680 A | 3/1998 | Ninomiya et al. | |
| 5,740,775 A | 4/1998 | Suzuki et al. | |
| 5,740,776 A | 4/1998 | Enderle et al. | |
| 5,746,183 A | 5/1998 | Parke et al. | |
| 5,778,850 A | 7/1998 | Buratti et al. | |
| 5,794,585 A | 8/1998 | Yonezawa et al. | |
| 5,803,049 A | 9/1998 | Harcombe | |
| 5,831,333 A | * 11/1998 | Malladi et al. | 257/713 |
| 5,832,901 A | 11/1998 | Yoshida et al. | |
| 5,839,275 A | 11/1998 | Hirota et al. | |
| 5,865,153 A | 2/1999 | Matsumoto | |
| 5,865,158 A | 2/1999 | Cleveland et al. | |
| 5,893,347 A | 4/1999 | McGee et al. | |
| 5,979,398 A | 11/1999 | Yanagihara | |
| 5,979,412 A | 11/1999 | Werner | |
| 5,986,871 A | 11/1999 | Forck et al. | |
| 6,000,384 A | 12/1999 | Brown et al. | |
| 6,006,727 A | 12/1999 | Katashiba et al. | |
| 6,009,849 A | 1/2000 | Yamanoto et al. | |
| 6,014,956 A | 1/2000 | Cowden et al. | |
| 6,021,370 A | 2/2000 | Bellinger et al. | |
| 6,026,780 A | 2/2000 | Barnes et al. | |
| 6,032,642 A | 3/2000 | Trumbower et al. | |
| 6,044,824 A | 4/2000 | Mamiya et al. | |

\* cited by examiner

APPARATUS AND METHOD FOR PROTECTING ENGINE ELECTRONIC CIRCUITRY FROM THERMAL DAMAGE

TECHNICAL FIELD

This invention relates generally to electronically controlled fuel injection systems and, more particularly, to thermal damage protection of the electronic circuitry associated with the control and operation of an engine.

BACKGROUND ART

Electronically controlled fuel injectors for engines are well known in the art including both hydraulically actuated electronically controlled fuel injectors as well as mechanically actuated electronically controlled fuel injectors. Electronically controlled fuel injectors typically inject fuel into a specific engine cylinder as a function of an injection signal received from associated electronic circuitry. These signals include waveforms that are indicative of a desired injection rate as well as the desired timing and quantity of fuel to be injected into the cylinders of the engine. Historically many fuel injection systems include a single main fuel injection, or shot, to the cylinder for each fuel injection event. More recently, split injections, post injections, and other multiple injection events are contemplated for use in an engine. In such configurations, each waveform may consist of one, two, three, or perhaps more, distinct and/or rate-shaped fuel shots to a cylinder during a particular fuel injection event.

Signals corresponding to the fuel injection waveforms, or fuel shots, are typically generated by electronic circuitry associated with a controller or other processing means commonly used to control the operation of the engine. Such circuitry typically controls the quantity of fuel delivered to each fuel shot associated with a particular injection waveform as well as the timing between the number of fuel shots and other parameters. The engine thereafter performs in accordance with the injector waveform signals thus received. Those skilled in the art will appreciate that the electrical load on the circuitry generating such signals will directly correspond to the frequency of the injection waveforms and the number of fuel shots in the waveforms. As the speed on the engine increases, the frequency of the waveforms will also increase, and therefore the frequency and number of fuel shots generated by the circuitry in a given time interval will likewise increase. Such increase in the firing frequency of fuel injection signals typically corresponds directly to an increase in the temperature of the circuitry due to the increase in performance thereof. If the temperature of the control circuitry increases and rises above a threshold level, various components of the electronic circuitry may be irreparably damaged.

As used throughout this disclosure, an injection event is defined as the injections that occur in a cylinder during one cycle of the engine. For example, one cycle of a four cycle engine for a particular cylinder, includes an intake, compression, expansion, and exhaust stroke. Therefore, the injection event in a four stroke engine includes the number of injections, or shots, that occur in a cylinder during the four strokes of the piston. The term shot as used in the art may also refer to the actual fuel injection or to the command current signal to a fuel injector or other fuel actuation device indicative of an injection or delivery of fuel to the engine.

Aside from engine speed or the firing frequency of the fuel injection shots, the temperature of the circuitry may rise above a threshold level due to other reasons as well. For example, when the voltage level of the power source providing electrical power to the circuitry drops below normal, or below a threshold level, the current delivered to the respective electronic components must be increased to compensate for the lower voltage in order to continue providing the same amount of electrical power to the injectors or other engine components. Higher current through the circuitry typically results in a higher circuit board temperature. Even a small drop in the voltage level of the power source from normal may result in an increase in the current sufficient to raise the temperature of the circuitry to a level at which the circuitry may be susceptible to thermal damage. Although it is possible to redesign and reengineer the circuitry to perform at higher current or higher power levels, such redesign and reengineering would be expensive and would add to the overall manufacturing costs of the engine.

It is therefore desirable to determine engine conditions or other criteria indicative of when the temperature of the electronic control circuitry associated with the engine control system increases, or has the propensity to increase, above a threshold level, and it is desirable to provide protection means to such circuitry to prevent damage thereto.

Accordingly, the present invention is directed to overcoming one or more of the problems as set forth above.

DISCLOSURE OF THE INVENTION

In one aspect of the present invention a method and apparatus is disclosed for the protection of the electronic circuitry associated with the operation of an engine, including the electrical and electronic components thereof, against thermal damage during certain engine operating conditions. An increase in the fuel injection frequency or engine control circuitry temperature above a threshold level for a certain period of time may cause thermal damage to the circuitry. This elevated temperature may be determined in any one of a variety of ways. For example, in a multi-shot fuel strategy, the frequency of the fuel shots delivered to the engine in a specific period of time will increase due to engine speed or engine load. Accordingly, as the engine speed increases for example, the frequency and number of current pulses generated and delivered to the fuel injection system by the fuel injector control circuitry within a specific period of time also increases. Generating a greater number of electrical current pulses may result in an increase in the overall temperature of the circuitry, including an increase in the temperature of the electrical or electronic components forming the overall control module. Accordingly, an electronic control module (ECM) is operable to monitor engine speed and/or other engine performance parameters and, based thereupon, can determine, correlate, or otherwise establish if the corresponding temperature of the electronic circuitry is approaching or has reached a predetermined threshold level.

Alternately, the ECM may also monitor the voltage level of the power source providing electrical power to the electronic circuitry associated with the engine. A drop in the voltage level of the power source below a normal or threshold voltage level will typically correspond to an increase in the amount of heat generated in the electronic circuitry because, if the voltage decreases, the amount of current provided by the power source must be increased in order to maintain the required amount of electrical power necessary to meet engine requirements. Accordingly, the ECM can determine or otherwise establish whether the temperature of the circuitry has exceeded a predetermined threshold level based upon a predetermined decrease in the voltage level of the power source.

Still further, a temperature sensor may be provided in proximity to the electronic circuitry associated with the engine control system, which temperature sensor is operable to sense the present or actual temperature of the circuitry and to output a signal indicative thereof. The temperature sensor is coupled to the ECM whereby the ECM will receive the signal emitted by such sensor and, based upon such temperature signal, will determine whether the temperature of the circuitry has exceeded a predetermined threshold level.

The ECM may be programmed to perform any one or more of a number of different actions to protect the electronic circuitry from thermal damage resulting from an undesirably high temperature. Under one such action, the ECM may restrict the number of fuel shots delivered by the circuitry to the fuel injectors of the engine during a fuel injection event. If the firing frequency of the multiple fuel shots are too high for a specific period of time, the electronics will get too hot. In this situation, in a three shot fuel injection system, for example, the ECM may limit the number of fuel shots in a particular fuel injection event to just one shot, or perhaps two shots. A reduction in the number of fuel shots will decrease the number of electrical pulses generated by the electronic circuitry thereby reducing the amount of thermal energy and heat generated by the circuitry which in turn reduces the overall temperature of the circuitry.

In another embodiment, the ECM may restrict the performance or operation of the engine in order to protect the electronic circuitry from thermal damage. In this case, the engine will not perform as requested by the operator, but will only perform at a reduced capacity, such as at a reduced speed, irrespective of the performance commanded by the operator. Reduced performance of the engine will translate into a reduced amount of electrical signals generated by the electronic circuitry, and therefore a decrease in the temperature associated therewith.

Depending upon what triggered the potential circuitry overheat situation, the restrictions imposed upon the engine's performance in an effort to help protect the circuitry associated therewith from thermal damage may be removed once the temperature of the circuitry returns to within predetermined threshold limits. On the other hand, depending upon the triggering event, the imposed restrictions may not be removed and it may be mandatory for an operator to have the engine or work machine serviced in order to correct the underlying problem. This may be true in the case of a low battery voltage condition where the battery, or alternator, or charging system must be replaced before any restriction on the engine's performance is removed.

In yet another embodiment, the event which triggered the present protection control system may be recorded in an appropriate memory or data recordation means associated with the ECM whereby a service technician may retrieve such information and data when the engine is serviced at a later time. Based upon such information, the service technician may properly investigate and repair the underlying cause which triggered the rise in the circuitry's temperature.

BRIEF DESCRIPTION OF THE DRAWING

For a better understanding of the present invention, reference may be made to the accompanying drawing in which.

BEST MODE FOR CARRYING OUT THE INVENTION

Figure 1:
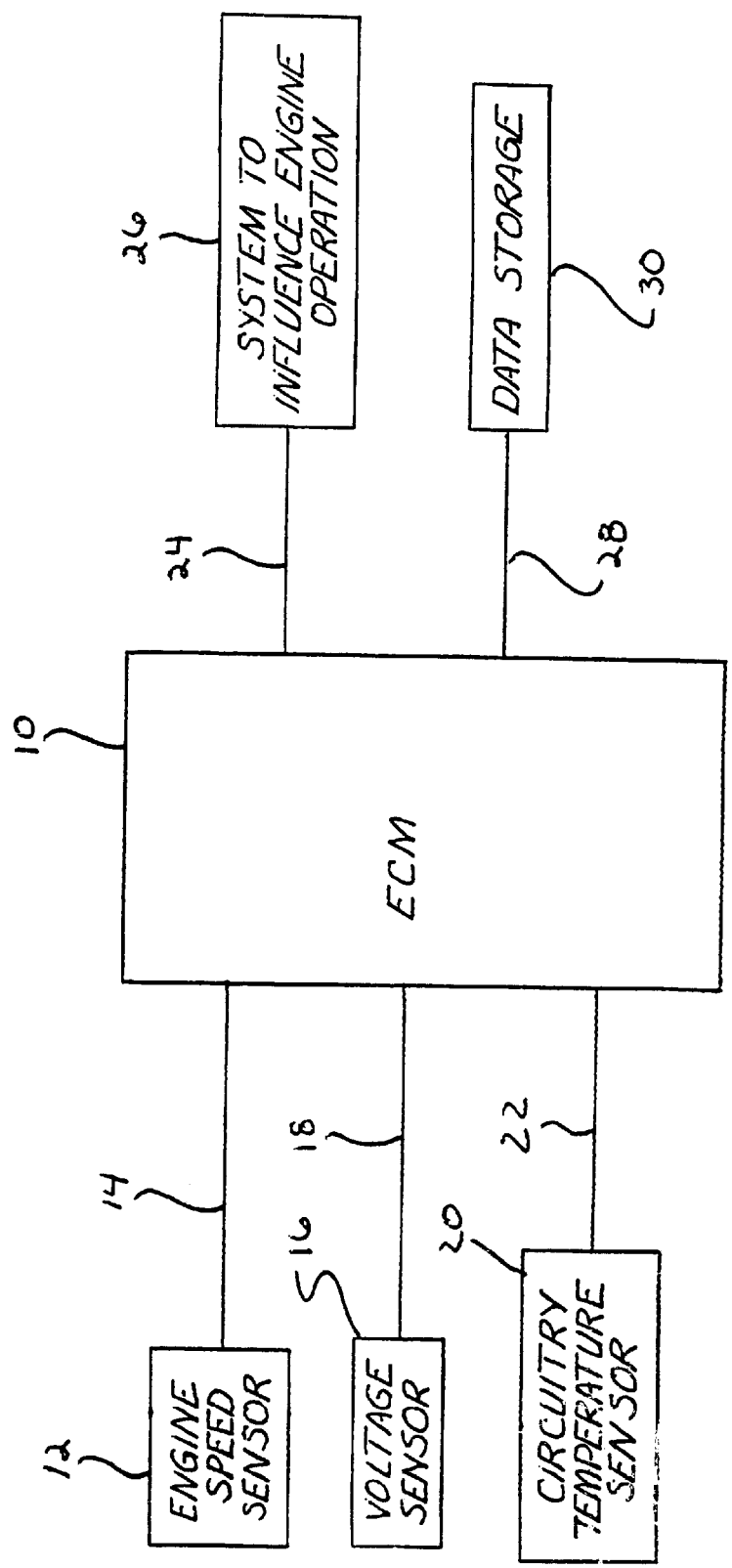
FIG. 1 is a schematic illustration of one embodiment of an electronic control system constructed and implemented in accordance with the teachings of the present invention.

Referring to FIG. 1, there is shown one embodiment of an electronic control system provided to help prevent thermal damage to electronic circuitry associated with the operation of an engine usable in work machines and other vehicles. The exemplary system shown in FIG. 1 is adaptable for use with any engine such as a compression ignition engine 12.

In one embodiment of the present invention, an electronic control module (ECM) 10, also referred to as a controller, is capable of preventing thermal damage to electrical and/or electronic circuitry associated with the operation of an engine, such as electronic controllers, electrical components such as resistors, capacitors, inductors, leads, traces, wires, electronic components such as diodes and transistors, electromagnetic components, fuel injection devices, driver circuits and the like. ECM 10 is preferably operable to receive one or more input signals indicative of certain engine or vehicle parameters whereby ECM 10 may determine, based upon one or more of the input signals, when to take action to prevent thermal damage to the circuitry. In this regard, ECM 10 is operable to output one or more signals to appropriate systems and/or other devices to take appropriate action to prevent thermal damage to the circuitry. Electronic controllers or modules such as ECM 10 are commonly used in association with engines for controlling and accomplishing various functions and tasks including monitoring and/or controlling a wide variety of engine functions such as engine speed, engine load, the speed of various fans and motors, fuel injection, and so forth. Controllers and electronic modules such as ECM 10 are typically utilized for delivering current control signals to devices such as control valves, pumps, actuators, solenoids, motor controllers, fuel injection units, and a wide variety of various other mechanical or electrical components to control the operation of the engine. In this regard, ECM 10 will typically include processing means such as a microcontroller or microprocessor, associated electronic circuitry such as input/output circuitry, analog circuits, and/or programmed logic arrays, associated memory and/or data storage means.

ECM 10 is preferably operable to sense a condition associated with the control of the operation of the engine. In one embodiment of the present invention, ECM 10 is coupled to a signal providing mechanism, such as an engine speed sensor 12, to receive an input signal 14 therefrom indicative of the present speed of the engine. Engine speed sensor 12 may be any one of various sensors known in the art operable to sense the speed of an engine and to emit a signal indicative thereof. Preferably, sensor 12 emits a continuous signal indicative of the present speed of the engine whereby ECM 10 may continuously monitor the operation thereof. One skilled in the art will appreciate that ECM 10 may thus monitor and determine the speed of an engine as well as other engine performance parameters at any given point in time, as well as over a specific period of time. It is, however, recognized and anticipated that in an alternate embodiment ECM 10 may already have engine speed and other performance data available to it if ECM 10 is also involved in controlling other aspects of the operation of the engine. Those skilled in the art will appreciate that in such an embodiment an additional sensor 12 to sense the actual engine speed will not be necessary.

In a fuel injection system performing multiple fuel injections, the operation of the engine typically includes the delivery of a plurality of fuel shots to each cylinder of the engine during a particular fuel injection event. This translates into a plurality of electrical pulses delivered to each fuel injector during a particular fuel injection event. Each fuel shot typically requires an electrical signal, or pulse, delivered by electronic circuitry associated with the engine. Therefore, a greater speed or performance of the engine will require a greater number of fuel shots per unit of time (firing frequency), or electrical pulses per unit of time delivered thereto by the electronic circuitry. A sustained increase in the speed and/or load of the engine will therefore require increased performance of the electronic circuitry, and such increase in the performance of the circuitry over a specific period of time may translate into a higher temperature associated with the operation of such circuitry, including the various electrical and electronic components comprising such circuitry. Therefore, ECM 10 may be programmed, or appropriate maps or tables may be formulated wherein engine speed and/or engine load over a specific period of time can be used to correlate or otherwise establish the temperature associated with the engine electronics. Based upon this programmed correlation, ECM 10 will be operable to determine or establish the temperature of the circuitry based upon the current engine speed or performance of the engine over a specific period of time. The current engine speed or performance of the engine, of course, translates into the firing frequency of the fuel injectors, and the period of time associated with a high engine speed or high performance may result in thermal damage to the circuitry in as little as a few seconds. In other words, the amount of thermal damage to the circuitry is dependent upon the temperature of the circuitry, and the period of time the temperature has been above a threshold level. Accordingly, when ECM 10 determines or otherwise establishes via sensor 12 and speed indicative signal 14 that such engine speed over a certain period of time may cause the fuel injection electronic circuitry to overheat and exceed a predetermined threshold temperature, ECM 10 will take proactive measures to prevent thermal damage to such circuitry and the components thereof. For example, ECM 10 may output an appropriate signal to restrict the speed of the engine and prevent such engine speed from remaining at its previously sustained level for a dangerously long time.

In another embodiment of the present invention, a signal providing mechanism, such as a voltage sensor 16, is operable to sense the voltage level of the power source providing electrical power to the electronic circuitry associated with the operation of the engine is coupled to ECM 10, the voltage sensor 16 outputting a signal 18 to ECM 10 indicative of the voltage sensed thereby. Such power source may be any source known in the art for providing electrical power to electronic circuitry associated with an engine such as a direct current battery, an alternator, or the like. A drop in the voltage level of the power source below a normal or threshold voltage level will typically correspond to an increase in the amount of heat generated in the electronic circuitry because, if the voltage decreases, the amount of current provided by the power source must be increased in order to maintain the required amount of electrical power necessary to meet engine requirements. Accordingly, the ECM can determine or otherwise establish whether the temperature of the circuitry has exceeded a predetermined threshold level based upon a predetermined decrease in the voltage level of the power source. ECM 10 can be programmed to correlate the threshold level voltage with a corresponding increase in the temperature of the circuitry. The appropriate maps and other tables may be formulated to correlate, for example, a decrease in battery voltage with the corresponding change in temperature of the electronic circuitry. If ECM 10 or some other controller is programmed to maintain the required output power to the control circuitry in order to meet the desired engine performance requested by the operator, current through the circuitry will be increased to compensate for the decrease in voltage. An increase in the current level through the circuitry for a sustained period of time, or above a threshold value, may raise the temperature of the circuitry significantly enough to cause thermal damage to the circuitry. Accordingly, when ECM 10 via sensor 16 and signal 18 determines that the voltage level of the power source has dropped below a predetermined threshold voltage level sufficient to cause potential thermal damage to the circuitry, ECM 10 will take proactive measures, such as output an appropriate signal to prevent or inhibit thermal damage to the electronics.

It is also recognized that the temperature associated with the circuitry at issue may likewise be sensed directly. In this regard, a signal providing mechanism, such as a temperature sensor 20, may be provided in proximity with the appropriate fuel injection engine circuitry and such sensor 20 can directly output a signal 22 indicative of the circuitry temperature. ECM 10 is coupled to temperature sensor 20 so as to receive signal 22 and, based upon such signal, ECM 10 can continuously monitor the temperature of the circuitry. Alternatively, it is recognized and anticipated that ECM 10 may monitor the temperature of the circuitry in a control loop, either continuously or at distinct predetermined time intervals. Based upon input signal 22, ECM 10 can determine when the temperature of the circuitry exceeds a predetermined threshold level and it can output an appropriate signal to prevent thermal damage to the circuitry.

Based upon any one or more of the signals 14, 18 and 22, ECM 10 can output one or more appropriate signals to take one or more actions, either individually or in combination, to prevent thermal damage to the electronic circuitry. For example, in one embodiment of the present invention, ECM 10 may output a signal 24 to a system 26 operable to influence the operation of the engine, whereby system 26 may restrict the engine's operation in order to reduce the electrical load upon the electronic circuitry at issue and therefore help lower the temperature thereof. Such action may include any relevant steps to dynamically modify the operation of the engine or the number of fuel injections commanded during a particular fuel injection event, such as restricting the number of fuel shots delivered to the fuel injectors during a particular fuel injection event which results in restricting or modifying the waveform delivered to the fuel injectors, reducing the top engine speed allowed for the engine, or otherwise derating the performance of the engine under these high power dissipation conditions. As a result, based upon the temperature of the electrical circuitry, ECM 10 can output or modify the appropriate fuel injection signals to the engine to prevent thermal damage thereto.

Restricting fuel shots to the engine will reduce the number of electrical pulses generated by the electronic circuitry therefor, and therefore the electrical load thereupon. A reduced electrical load will translate into a lower temperature associated with the electronic circuitry and hence thermal damage thereto may be prevented. Therefore, in one embodiment, in a fuel system utilizing a multi-injection control strategy, the fuel injection signal is determined in response to the temperature of the electronic control strategy. For example, the number, timing, and duration of the injections in an injection signal may be determined in response to the speed and load of the engine. If the circuitry temperature exceeds a threshold, the injection signal may be modified prior to delivery, to reduce the number of injections (or shots) per injection event, reallocate the fuel among the remaining injections, and thus reduce the circuitry temperature. Alternately, the temperature may be accounted for initially when creating the injection signal, rather than determining an initial signal and then modifying the injection signal. Therefore, in a control strategy using multiple injections per fuel injection event, such as a pilot, main, and anchor shot, the number of injections may be reduced, such as eliminating the pilot shot, when the temperature exceeds a threshold. The control strategy then also determines how to distribute the fuel previously allocated to the pilot shot to the remaining main and anchor shots while minimizing engine emissions and maintaining engine performance.

Alternatively, instead of restricting engine performance, or in combination therewith, ECM 10 can also be operable to take still other actions to prevent thermal damage to the electronics associated with the engine. For example, ECM 10 may output a signal to stop the engine, or activate a warning light for the operator. Alternatively, a fan or other temperature cooling means may be invoked to cool the temperature of the circuitry at issue. All such variations and embodiments in controlling the temperature of the electronics at issue, whether used alone or in combination with other preventive measures, are recognized and anticipated, and all such variations and modifications are within the spirit and scope of the present invention.

Subsequent to taking action to prevent thermal damage to the electronic circuitry, ECM 10 may thereafter control the operation of the engine in a number of different ways. For example, in one embodiment, ECM 10 may continue to restrict or derate the engine's performance during high engine speeds or high power dissipation levels thereby forcing the operator to service the engine, the power source or other appropriate system before normal operations will be resumed. Such embodiment would be desirable in situations wherein it is preferable that the underlying problem causing the rise in the temperature of the electronic circuitry be identified and remedied relatively soon such as when the voltage level of the power source has dropped below a minimum desirable threshold level. Alternatively, ECM 10 may continue to restrict the engine's performance for as long as it determines that the temperature of the electronic circuitry exceeds a desirable level and, if ECM 10 senses that the temperature of the circuitry has returned to within limits or has dropped below a second predetermined threshold value, ECM 10 may then output appropriate signals to allow any restriction previously imposed to be lifted and to allow engine operation to return to normal.

In still another embodiment of the present invention, ECM 10 may maintain a record of the events which caused the temperature of the circuitry to approach or exceed a threshold limit. Such record may be maintained in memory means or other data storage means associated with ECM 10 for later retrieval by a service tool. In such an embodiment, ECM 10 will output a signal 28 indicative of the information or data desirable to be recorded or preserved to a memory means or other data storage means 30 coupled to ECM 10 as illustrated in FIG. 1. Such information may be subsequently retrieved and analyzed by a service technician and the underlying cause thereof may be identified and addressed appropriately at that time.

Industrial Applicability

As described herein, the present apparatus and method has particular utility in all types of engines, such as engines utilized in vehicles, work machines, marine vessels, electrical generators, stationary engines, and the like. The present apparatus and method, therefore, provides a control system and method for detecting and preventing thermal damage to electronic circuitry associated with any engine without requiring the circuitry to be redesigned or reengineered to perform at higher current levels or to handle undesirably high power loads.

Electronic circuitry associated with an engine typically includes a wide variety of electronic control modules, electronic components, connections, conductors and/or traces that couple the various input and output terminals of the components to the inputs and outputs of other components. Such circuitry typically takes the form of one or more printed circuit boards constructed to control and handle specific engine functions and operations such as controlling fuel injection to the engine. Those skilled in the art will appreciate that the various components which comprise such circuit boards and control modules such as microprocessors and integrated circuits are particularly sensitive to excessive current levels or higher power levels, and reengineering such components to perform at higher current and power levels would be an expensive process. The present invention, therefore, obviates the need to overdesign such electronics so as to handle the worse case scenarios of high current and/or high power levels and prevents the necessity for such expense by providing an apparatus and method which will monitor, detect and prevent thermal damage to the circuitry if the operation of the engine causes the circuitry temperature to reach an undesirably high temperature.

The present apparatus and method has multiple purposes. When the power supply or charging system is operating at its normal or nominal voltage, the present control system defines limits at which performance engineers and/or emissions engineers can operate the engine so as to both prevent a thermal overload of the associated electronics as well as to prevent poor emissions. In other words, if the power source is operating within normal limits, the present control system may restrict the number of pulses or firing frequency of the multiple fuel shots at high engine speeds by restricting the number and/or type of waveforms allowed under such conditions so as to reduce the number of fuel shots in a particular fuel injection event thereby reducing the number of electrical pulses generated by the electronic circuitry so as to control and prevent thermal damage to such circuitry. Even though the firing frequency of the multiple fuel shots for a specific period of time may be restricted, the present control system ensures that the exhaust emissions remain within proper limits and meet emissions standards.

On the other hand, the present control system likewise functions to define proper engine operating conditions when the power supply or charging system is not operating within normal or nominal limits so as to again prevent thermal damage to the associated electronic circuitry as well as to prevent poor emissions. In this particular situation, the present control system will restrict engine operation and may deregulate engine performance so as to both protect the electronic circuitry from thermal damage and to provide an incentive to the vehicle or machine operator to return the vehicle or machine to the shop so that the charging system or power source can be analyzed and any malfunction repaired. This restriction in the performance or operation of the engine may take the form of restricting the electrical waveform delivered to the respective cylinders; it may take the form of reducing the top speed of the machine or vehicle; or it may impose other restrictions on the overall performance of the vehicle or machine. Regardless of the type of restrictions imposed upon the engine's performance under this particular scenario, the present control system will again prevent thermal damage to the associated electronics and will maintain emissions within proper limits during reduced performance of the engine. Depending upon the particular problem or malfunction associated with the power supply and/or charging system, the present control system may account for the worst case scenario and provide engine performance which will yield desired emissions as well as prevent thermal overload of the associated electronics.

It is recognized and anticipated that the engine performance threshold values, the time periods of performance monitoring by ECM 10, and the like, may be pre-programmed in the ECM 10, or such values may be available in maps or tables stored in a memory means or data storage means associated with ECM 10. Alternatively, such values may be determined by appropriate formulas or mathematical computations to be performed by ECM 10 in a continuing loop or at fixed time intervals. Accordingly, it is recognized and anticipated that ECM 10 may perform such steps in any one of the various ways known in the art.

It is also recognized and anticipated that ECM 10 may determine whether to take action to prevent thermal damage to the circuitry based on just one of the various inputs thereto, or it may do so based on a combination of such inputs, possibly even giving different weight to the different input values. Further, it is recognized and anticipated that the action taken by ECM 10 may be any one or a combination of the various actions that it is capable of taking, including the actions discussed herein above.

It is further recognized and anticipated that the present invention may be scaled to individually monitor one or more of a plurality of electronic circuits associated with the operation of an engine, or a combination thereof, or even discrete portions of different circuits. In such embodiments, ECM 10 may be adapted to take appropriate action with respect only to the particular circuit or circuits that exceed their threshold values.

Still further, it is recognized and anticipated that depending upon what triggered the potential circuitry overheat situation, the restrictions imposed upon the engine's performance in an effort to help protect the circuitry associated therewith from thermal damage may be removed once the temperature of the circuitry returns to within predetermined threshold limits. On the other hand, depending upon the triggering event, the imposed restrictions may not be removed and it may be mandatory for an operator to have the engine or work machine serviced in order to correct the underlying problem. This may be true in the case of a low battery voltage condition where the battery must be replaced before any restriction on the engine's performance is removed. Accordingly, all such variations and combinations are recognized and anticipated, and it is intended that the claims shall cover all such embodiments which do not depart from the spirit and scope of the present invention.

As is evident from the foregoing description, certain aspects of the present invention are not limited by the particular details of the examples illustrated herein, and it is therefore contemplated that other modifications and applications, or equivalents thereof, will occur to those skilled in the art. It is likewise intended that the claims shall cover all such modifications and applications that do not depart from the sprit and scope of the present invention.

Other aspects, objects and advantages of the present invention can be obtained from a study of the drawings, the disclosure and the appended claims.

What is claimed is:

1. A control system for preventing thermal damage to electronic circuitry associated with the operation of an engine, said control system comprising:

an electronic controller coupled to the engine;

at least one signal providing mechanism coupled to said controller for inputting a signal thereto indicative of a condition which can be correlated to the temperature of the electronic circuitry;

said controller being operable to output a signal to effectively lower the temperature of the electronic circuitry when said input signal is indicative of a condition which corresponds to the temperature of the electronic circuitry exceeding a predetermined threshold temperature.

2. The control system as set forth in claim 1 wherein said controller is further operable to discontinue said signal to effectively lower the temperature of the electronic circuitry when said input signal is no longer indicative of a condition which corresponds to the temperature of the electronic circuitry exceeding a predetermined threshold temperature.

3. The control system as set forth in claim 1 wherein said signal outputted by said controller to effectively lower the temperature of the electronic circuitry is a signal to control the number of fuel injection shots delivered to the engine during a particular fuel injection event.

4. The control system as set forth in claim 1 wherein the engine includes a plurality of electronically controlled fuel injectors, said signal outputted by said controller to effectively lower the temperature of the electronic circuitry being a signal to control the firing frequency of said fuel injectors for a predetermined period of time.

5. The control system as set forth in claim 1 wherein said input signal is indicative of engine speed, said controller outputting said signal to effectively lower the temperature of the electronic circuitry when said engine speed exceeds a threshold speed.

6. The control system as set forth in claim 5 wherein said signal providing mechanism includes an engine speed sensor.

7. The control system as set forth in claim 1 wherein said input signal is indicative of the voltage level of the electrical power being supplied to the electronic circuitry, said controller outputting said signal to effectively lower the temperature of the electronic circuitry when said voltage level is below a threshold value.

8. The control system as set forth in claim 7 wherein said signal providing mechanism includes a voltage sensor coupled to a power source providing electrical power to the electronic circuitry.

9. The control system as set forth in claim 1 wherein said input signal is indicative of the temperature of the electronic circuitry, said controller outputting said signal to effectively lower the temperature of the electronic circuitry when said temperature exceeds a predetermined threshold temperature.

10. The control system as set forth in claim 9 wherein said signal providing mechanism is a temperature sensor coupled to the electronic circuitry.

11. The control system as set forth in claim 1 further comprising data storage means coupled to said controller to receive an output signal from said controller, said data storage means being operable to store data indicative of a condition which corresponds to the temperature of the electronic circuitry exceeding a predetermined threshold temperature.

12. The control system as set forth in claim 11 wherein said stored data is retrievable by means of a service tool for use at a later time.

13. The control system as set forth in claim 1 wherein the signal outputted by said controller to effectively lower the temperature of the electronic circuitry includes a signal to a system operable to restrict the operation of the engine.

14. The control system as set forth in claim 13 wherein said signal restricting the operation of the engine is discontinued when the temperature of the electronic circuitry reaches a second predetermined temperature for a specified period of time.

15. A control system for preventing thermal damage to electronic circuitry associated with the operation of an engine, said control system comprising:
- an electronic controller coupled to the engine;
- one or more sensors coupled to said controller for inputting certain signals thereto representative of certain conditions affecting the operation of the engine;
- said controller being operable to establish the temperature of the electronic circuitry based upon at least one of said input signals;
- said controller being further operable to output a signal to effectively lower the temperature of the electronic circuitry when said temperature exceeds a predetermine threshold temperature.

16. The control system as set forth in claim 15 wherein at least one of said sensors is an engine speed sensor operable to input a signal to said controller indicative of the speed of the engine, said controller being operable to establish the temperature of the electronic circuitry based upon the signal inputted by said engine speed sensor.

17. The control system as set forth in claim 15 wherein at least one of said sensors is a voltage sensor operable to sense the voltage level of the power source supplying electrical power to the electronic circuitry, said controller being operable to establish the temperature of the electronic circuitry based upon the signal inputted by said voltage sensor.

18. The control system as set forth in claim 15 wherein at least one of said sensors is a temperature sensor operable to sense the temperature of the electronic circuitry, said controller being operable to establish the temperature of the electronic circuitry based upon the signal inputted by said temperature sensor.

19. The control system as set forth in claim 15 wherein said controller is operable to establish the temperature of the electronic circuitry based upon more than one input signal from a plurality of sensors, said controller outputting a signal to effectively lower the temperature of the electronic circuitry based upon a predetermined combination of said input signals.

20. The control system as set forth in claim 19 wherein the engine receives a signal indicative of a plurality of fuel shots during a particular fuel injection event, said signal outputted by said controller to effectively lower the temperature of the circuitry being indicative of restricting the number of fuel shots in said fuel injection event.

21. The control system as set forth in claim 19 wherein said signal outputted by said controller to effectively lower the temperature of the circuitry is indicative of restricting the performance of said engine.

22. A method for preventing thermal damage to electronic circuitry associated with the operation of an engine, the method comprising the steps of:
- (a) sensing a condition associated with the control of the operation of the engine;
- (b) establishing the temperature associated with the electronic circuitry based upon said sensed condition;
- (c) comparing the established temperature of the electronic circuitry with a threshold temperature; and
- (d) outputting a signal to effectively lower the temperature of the electronic circuitry when the established temperature exceeds the threshold temperature.

23. The method as set forth in claim 22 further comprising the step of establishing said threshold temperature such that continued operation of said circuitry above said threshold temperature may result in thermal damage to said circuitry.

24. The method as set forth in claim 22 wherein said sensed condition is the speed of the engine.

25. The method as set forth in claim 22 wherein said sensed condition is the voltage level of the power source which delivers electrical power to the electronic circuitry.

26. The method as set forth in claim 22 wherein said sensed condition is the temperature of the electronic circuitry.

27. The method as set forth in claim 22 including the steps of:
- outputting a signal to a data storage means to store data indicative of said sensed condition when the established temperature of the electronic circuitry exceeds the threshold temperature.

28. The method as set forth in claim 22 including the step of:
- outputting a signal restricting the operation of the engine when the established temperature of the electronic circuitry exceeds the threshold temperature.

29. The method as set forth in claim 28 including the step of:
- discontinuing said signal to restrict the operation of the engine when the temperature of the electronic circuitry drops below a second predetermined threshold temperature for a predetermined period of time.

30. The method as set forth in claim 22 wherein said signal to effectively lower the temperature of the electronic controller is a signal to control the number of fuel injection firings to the engine during a particular fuel injection event.

31. A method for preventing thermal damage to electronic circuitry associated with a fuel system, the electronic circuitry being adapted to control one or more fuel injection devices, the method comprising the steps of:
- establishing a temperature of the electronic circuitry; and
- generating a fuel injection signal based upon said established temperature.

32. The method as set forth in claim 31 further comprising sensing an engine speed and an engine load, and wherein the step of establishing a temperature of the electronic circuitry is based upon at least one of said sensed engine speed and engine load.

33. The method as set forth in claim 31 wherein the step of generating said fuel injection signal further includes sensing an engine speed and an engine load and generating said fuel injection signal in response to said sensed engine speed and engine load.

34. The method as set forth in claim 31 further comprising the step of dynamically modifying said fuel injection signal in response to said established temperature.

35. A control system for preventing thermal damage to electronic circuitry associated with a fuel system of an engine, the electronic circuitry being adapted to control one or more fuel injection devices and generating fuel injection signals to control the operation of the engine, said control system comprising:
- an electronic controller coupled to the fuel injection devices;
- at least one sensor coupled to said controller for inputting certain signals thereto representative of certain conditions affecting the operation of the engine;
- said controller being operable to establish a temperature for the electronic circuitry based upon at least one of said input signals;
- said controller being further operable to output a fuel injection signal in response to said established temperature.

36. The control system as set forth in claim 35 wherein said certain input signals are indicative of the speed and load of the engine, said controller being further operable to output said fuel injection signal in response to said engine speed and engine load.

37. The control system as set forth in claim 35 wherein said certain input signals are indicative of the speed and load of the engine, said controller being further operable to establish the temperature for the electronic circuitry based upon at least one of said engine speed and engine load.

* * * * *